(12) United States Patent
Chan et al.

(10) Patent No.: US 8,831,140 B2
(45) Date of Patent: Sep. 9, 2014

(54) PROTOCOL-AGNOSTIC AUTOMATIC RATE NEGOTIATION FOR HIGH-SPEED SERIAL INTERFACE IN A PROGRAMMABLE LOGIC DEVICE

(75) Inventors: Allen Chan, San Jose, CA (US); Wilson Wong, San Francisco, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 587 days.

(21) Appl. No.: 11/687,052

(22) Filed: Mar. 16, 2007

(65) Prior Publication Data
US 2008/0225933 A1 Sep. 18, 2008

(51) Int. Cl.
*H04L 27/00* (2006.01)
*H03K 19/177* (2006.01)
*G06F 13/38* (2006.01)
*H04L 5/14* (2006.01)

(52) U.S. Cl.
CPC ........ *G06F 13/385* (2013.01); *H03K 19/17744* (2013.01); *H03K 19/177* (2013.01); *H04L 5/1446* (2013.01)
USPC ........................................................ 375/316

(58) Field of Classification Search
CPC ................ H04L 5/1446; G06F 13/385; H03K 19/17744; H03K 19/177
USPC .......................................................... 375/316
See application file for complete search history.

(56) References Cited

U.S. PATENT DOCUMENTS

| | | | | |
|---|---|---|---|---|
| 5,243,299 A * | 9/1993 | Marchetto et al. | ............ | 329/300 |
| 5,257,019 A * | 10/1993 | Schwendeman et al. | ........................ | 340/825.49 |
| 5,491,713 A * | 2/1996 | Kwok et al. | .................. | 375/333 |
| 5,838,749 A * | 11/1998 | Casper et al. | ................. | 375/376 |
| 5,995,512 A * | 11/1999 | Pogue, Jr. | ..................... | 370/419 |
| 6,049,254 A * | 4/2000 | Knapp et al. | .................... | 331/16 |
| 6,223,083 B1 * | 4/2001 | Rosar | ............................... | 607/60 |
| 6,243,429 B1 * | 6/2001 | Akahori | ........................ | 375/340 |
| 6,683,920 B1 * | 1/2004 | Coy | ................................. | 375/326 |
| 6,694,104 B1 * | 2/2004 | Caplan et al. | ................. | 398/197 |
| 6,798,869 B1 | 9/2004 | Sidhu et al. | | |
| 6,826,717 B1 * | 11/2004 | Draper et al. | ................... | 714/39 |
| 6,970,020 B1 * | 11/2005 | Mei et al. | .......................... | 327/3 |
| 7,020,227 B1 * | 3/2006 | Wang et al. | ................... | 375/355 |
| 7,183,864 B1 * | 2/2007 | Gutnik | ............................. | 331/57 |
| 2004/0114702 A1 * | 6/2004 | Friedman et al. | ............. | 375/373 |
| 2005/0078745 A1 * | 4/2005 | Sinha et al. | ................... | 375/225 |
| 2005/0093580 A1 * | 5/2005 | Baig et al. | ........................ | 327/65 |
| 2005/0111589 A1 * | 5/2005 | Centurelli et al. | ............. | 375/325 |
| 2005/0257030 A1 * | 11/2005 | Langhammer | ................ | 712/226 |
| 2006/0256909 A1 * | 11/2006 | On et al. | ........................ | 375/376 |
| 2008/0080649 A1 * | 4/2008 | Gibbons et al. | ............... | 375/355 |

OTHER PUBLICATIONS

"The Realization of a Frequency Measurement System with High Precision and Speed Based on FPGA," *Sensorworld*, vol. 12, No. 1 (Jan. 25, 2006).

\* cited by examiner

*Primary Examiner* — Juan A Torres
(74) *Attorney, Agent, or Firm* — Ropes & Gray LLP

(57) ABSTRACT

Automatic rate negotiation logic for a high speed serial interface in a programmable logic device determines whether multiple occurrences of a single-bit transition (i.e., a data transition from "0" to "1" to "0" or from "1" to "0" to "1") occur within a predetermined time interval on a data channel of a high-speed serial interface. The interval preferably is selected such that multiple occurrences of a single-bit transition mean that the data channel is operating in full-rate mode. The rate negotiation logic may share a phase detector with clock data recovery circuitry in the interface. The phase detector may be a bang-bang phase detector specially adapted to detect single-bit transitions.

18 Claims, 7 Drawing Sheets

PROTOCOL-AGNOSTIC AUTOMATIC RATE NEGOTIATION FOR HIGH-SPEED SERIAL INTERFACE IN A PROGRAMMABLE LOGIC DEVICE

BACKGROUND OF THE INVENTION

This invention relates to a high-speed serial interface, especially in a programmable logic device (PLD), which may operate at different data rates.

It has become common for PLDs to incorporate high-speed serial interfaces to accommodate high-speed (i.e., greater than 1 Gbps) serial input/output (I/O) standards. Many of these standards can operate at more than one clock rate. Moreover, for any given clock rate, the clock rate may equal the data rate (this is referred to as "full rate" operation, in which data is clocked only on upward transitions of the clock signal), or the clock rate may be half the data rate (this is referred to as "half rate" operation, in which data is clocked on both upward and downward transitions of the clock signal, so that the clock rate is half of the effective data rate). However, it is a common feature of most if not all high-speed serial data protocols that neither the clock nor information about the clock is sent with the data. Instead, the clock must be recovered from the data.

For this purpose, it is known to use "clock data recovery" techniques in high-speed serial interfaces. Such techniques recover the clock from serial data using a closed-loop feedback system including, e.g., a phase-locked loop or delay-locked loop.

After the clock has been recovered, it is necessary to determine the data rate, which may, for example, be equal to the clock rate ("half rate" mode) or twice the clock rate ("full rate" mode), although other combinations of rates are possible. Frequently, that determination is made by logic in the PLD that is specific to the particular protocol, whether in the programmable logic of the PLD or in interface circuitry. For example, copending, commonly-assigned U.S. patent application Ser. No. 11/490,406, filed Jul. 19, 2006, describes an automatic rate negotiation mechanism that relies, for some rate changes, on a signal from the PLD logic indicating that a rate change is necessary. Such systems require the provision in the device of logic (hard logic or user-programmed logic), which may be dependent on the protocol in use (e.g., Gigabit Ethernet, Serial ATA, 1G, 2G, 4G or 8G Fibre Channel, Serial RapidIO, PCI-Express or PCI-Express 2.0, Infiniband, SerialLite, etc.), to assist in the rate negotiation.

It would be desirable to be able to provide, in a PLD transceiver, rate negotiation that is independent of the protocol in use and can operate independently of the remainder of the PLD.

SUMMARY OF THE INVENTION

The present invention takes advantage of existing CDR circuitry in a PLD transceiver, and of transition-rich encoding, such as the 8B/10B encoding scheme commonly used, regardless of protocol, to encode high-speed serial data.

The invention may be used to distinguish between operation of a data channel in full-rate mode and operation in half-rate mode. This can be done by determining whether two occurrences of a single-bit transition (i.e., a data transition from "0" to "1" to "0" or from "1" to "0" to "1") occur within a predetermined time interval. The interval preferably is selected such that two occurrences of a single-bit transition mean that the data channel is operating in full-rate mode.

The invention may be used with other pairs of rates that are multiples of one another. Thus, if one rate is n times the other, the system would look for n transitions during the predetermined interval within the link training sequence.

Thus, in accordance with the present invention there is provided a method for determining a data rate in a programmable logic device serial interface channel operating at a clock rate. The method includes monitoring the channel for occurrence of single-bit transitions, and on detection of a plural number of those single-bit transitions within a predetermined duration, concluding that the data rate is substantially a multiple of the clock rate.

A serial interface adapted to perform the method, and a programmable logic device incorporating that serial interface, also are provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention preferably is used to detect whether a data channel of a high-speed serial interface is operating in full-rate mode or half-rate mode, by determining whether two occurrences of a single-bit transition (i.e., a data transition from "0" to "1" to "0" or from "1" to "0" to "1") occur within a predetermined time interval on that data channel. The interval preferably is selected such that two occurrences of a single-bit transition mean that the data channel is operating in full-rate mode.

However, in order to be certain that lack of two occurrences within the predetermined interval during the training period means that the channel is operating in half-rate mode, the system preferably begins in half-rate mode. This is clear if one considers the possibilities of beginning in full-rate mode and beginning in half-rate mode.

First, if the system were to begin in full-rate mode, the lack of two occurrences within the predetermined interval would be ambiguous. It could mean that the channel is operating in half-rate mode and the system should switch to half-rate mode, but it also could mean that the channel is in full-rate mode but that the particular data being received happens to lack single-bit transitions and the system should not switch to half-rate mode.

Second, if the system starts in half-rate mode while the channel is operating in full-rate mode, eventually a pair of single-bit transitions close enough together to be within the predetermined interval will be detected, meaning that the channel cannot possibly be operating in half-rate mode, and will cause the system to switch to full-rate mode.

Thus, starting in half-rate mode is preferred.

Although the method of the invention can be used with any transition-rich encoding scheme as long as the link training sequence includes a single-bit transition, in a preferred embodiment the invention is used with the 8B/10B encoding scheme in which every eight bits of data are encoded along with two control bits, and which is known to have many single-bit transitions.

Preferably, the bang-bang phase detector (BBPD) within the clock data recovery (CDR) circuitry of the transceiver is shared with the rate negotiation circuitry. This phase detector is used by the CDR circuitry to properly center the clock-to-data phase relationship. This preferably establishes a known phase relationship within the rate negotiation circuitry to ensure a proper logic decision as to what the data rate is.

In accordance with this invention, the BBPD preferably includes additional features that are not found in a conventional BBPD, to find and output the transition information in the incoming serial data. A preferred embodiment of the modifications of the conventional BBPD is described in greater detail below.

The invention will now be described with reference to FIGS. 1-8.

Figure 1:
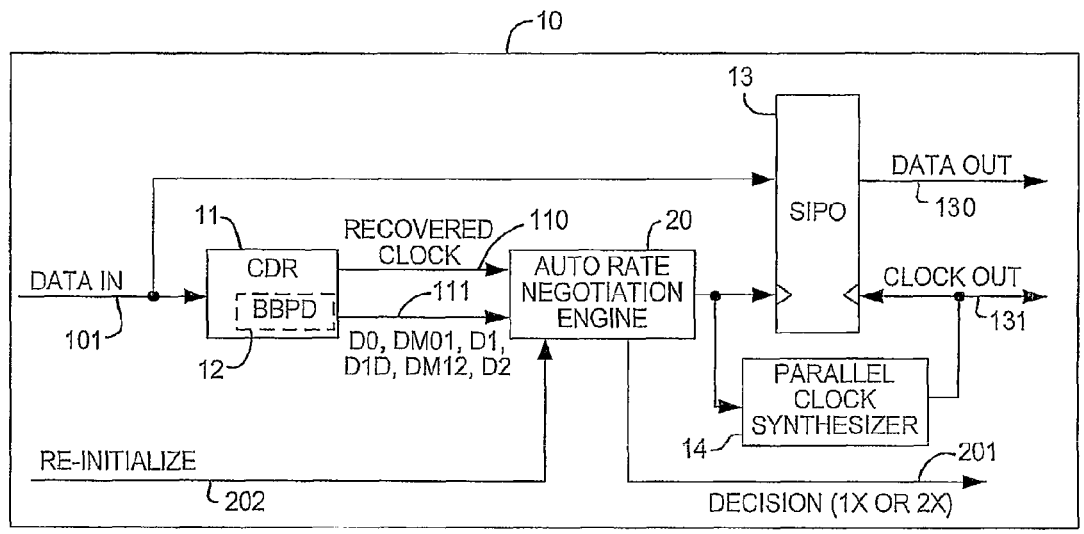
FIG. 1 is a structural block diagram of a preferred embodiment of a transceiver channel incorporating the present invention.

FIG. 1 is a structural block diagram of a preferred embodiment of a transceiver channel 10 incorporating rate negotiation circuitry 20 in accordance with the present invention. As seen in FIG. 1, channel 10 preferably includes CDR circuitry 11 incorporating a BBPD 12, followed by rate negotiation circuitry 20, deserializer or Serial-In/Parallel-Out (SIPO) module 13 and parallel clock synthesizer 14.

Serial data is received at 101 and preferably input to both CDR circuitry 11 and deserializer 13. CDR circuitry 11, using BBPD 12 in substantially the conventional way, recovers clock 110 and passes it to rate negotiation circuitry 20 along with preferred signals 111 (discussed in more detail below) for use by rate negotiation circuitry 20. Rate negotiation circuitry 20 preferably passes recovered clock 110 to deserializer 13 and parallel clock synthesizer 14 (which essentially is a divide-by-m circuit where m is the number of bits per word or byte), which preferably convert received serial data 101 to parallel data 130, and output parallel clock 131, for use by the PLD of which channel 10 is a part. Rate negotiation circuitry 20 preferably also determines according to the present invention whether channel 10 is operating in full-rate mode or half-rate mode (or whatever combination of rates the particular embodiment is designed for as discussed above), outputting a rate decision signal 201 for use by the PLD logic.

Figure 2:
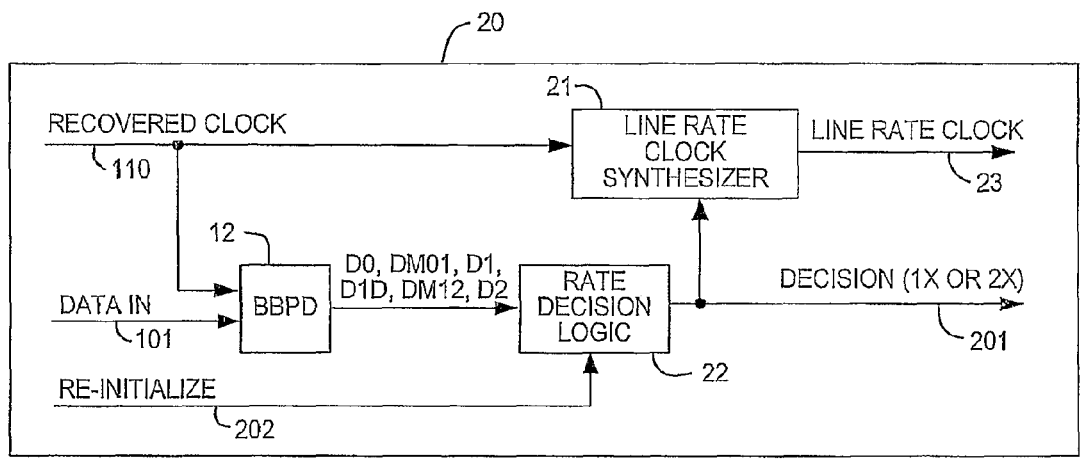
FIG. 2 is a structural block diagram of rate negotiation circuitry in accordance with a preferred embodiment of the present invention.

A preferred embodiment of rate negotiation circuitry 20 is shown in FIG. 2. BBPD 12 is the same BBPD shown in FIG. 1. Although BBPD 12 ordinarily is housed in CDR circuitry 11, or external to both CDR circuitry 11 and rate negotiation circuitry 20, for ease of consideration, it is shown here as part of rate negotiation circuitry 20.

In addition to BBPD 12, rate negotiation circuitry 20 includes line rate clock synthesizer 21 and rate decision logic 22. Recovered clock 110 is input to both BBPD 12 and line rate clock synthesizer 21. BBPD 12 operates on recovered clock 110 as well as data 101 to provide signals 111 as discussed in more detail below. Signals 111 are used by rate decision logic 22, as discussed below, to decide whether channel 10 is in full-rate mode or half-rate mode. Rate decision logic 22 outputs rate decision signal 201 for use by the PLD logic (as discussed above) and also by line rate clock synthesizer 21 to output line rate 23, which is either a full-rate or half-rate clock synthesized from the recovered clock based on the full-rate/half-rate decision. The synthesized clock will have the correct data-to-clock phase relationship to ensure proper timing margins. A reinitialize input signal 202 is provided to allow the user or the PLD logic to reset rate decision logic 22 so that it starts the rate decision process over as discussed below.

Figure 3:
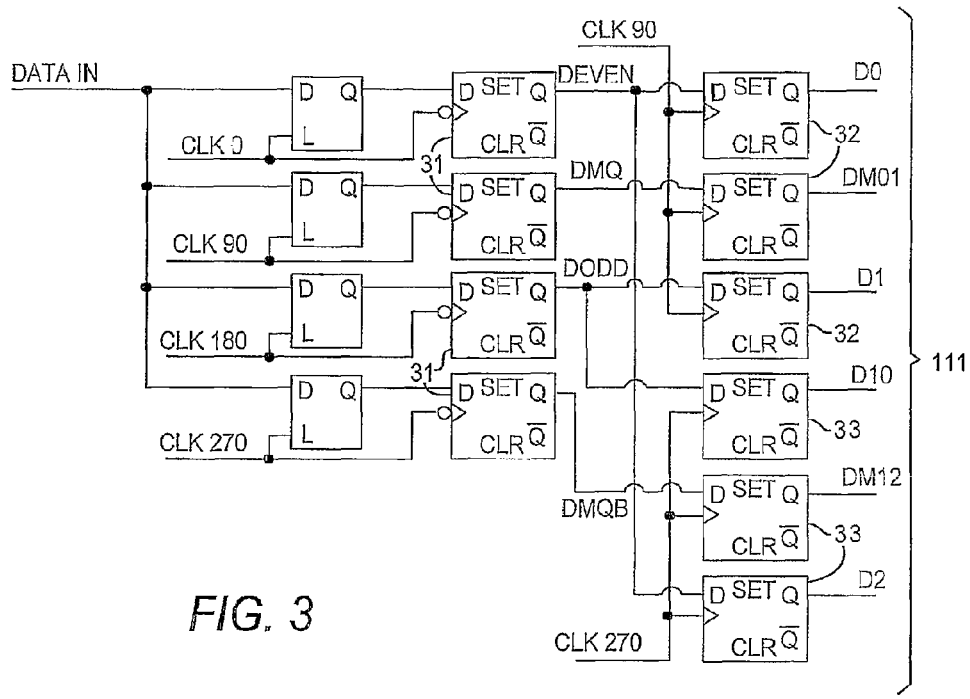
FIG. 3 is a structural block diagram of a bang-bang phase detector in accordance with a preferred embodiment of the present invention.

The details of BBPD 12 are shown in FIG. 3. The first column of flip-flops 31 are clocked by a four-phase clock with phases 0, 90, 180 and 270, running at half the data rate. These flip-flops 31 sample the data and generate the outputs DEVEN, DMQ, DODD and DMQB, which represent data sample points A, ATB (A-to-B transition), B and BTC (B-to-C transition), respectively, in the timing diagram of FIG. 4. The flip-flops 32 which generate outputs D0, DM01 and D1 (three of the six signals 111) are clocked by CLK90. The purpose of these flip flops is to synchronize A, ATB and B to that one clock domain. Similarly, the flip-flops 33 which generate D10, DM12 and D2 (three of the six signals 111) synchronize B, BTC and C to the CLK270 clock domain.

The timing diagrams in FIGS. 4-8 illustrate the operation of rate decision logic 22.

Rate decision logic 22 relies on the presence of single-bit transitions in the incoming data. In the case of 8B/10B encoding, the assumption may be made that standard protocols (e.g., Gigabit Ethernet, Serial ATA, 1G, 2G, 4G or 8G Fibre Channel, Serial RapidIO, PCI-Express or PCI-Express 2.0, Infiniband, SerialLite, etc.) utilize the K28.5 8B/10B control character, which includes a single-bit transition, during the link initialization process. While the K28.5 control character is not required, a control character or a data character with a single-bit transition is required. Nine out of the twelve valid 8B/10B control characters include such a transition. When one of the three control characters that lack a single-bit transition is used, a data character that includes a single bit transition may be embedded within the training sequence.

Figure 4:
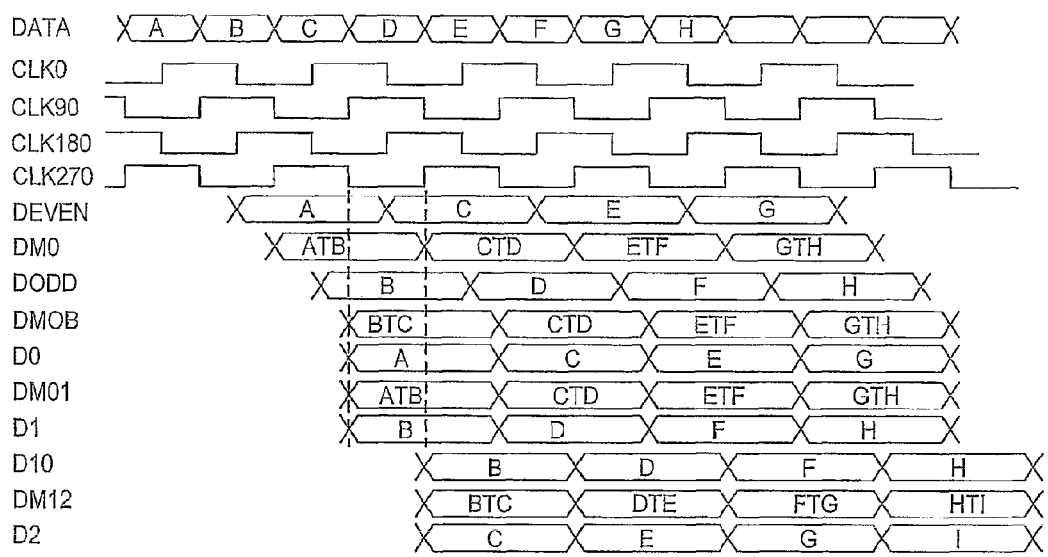
FIGS. 4-8 are timing diagrams illustrating operation of rate decision logic in accordance with a preferred embodiment of the present invention.
Figure 5:
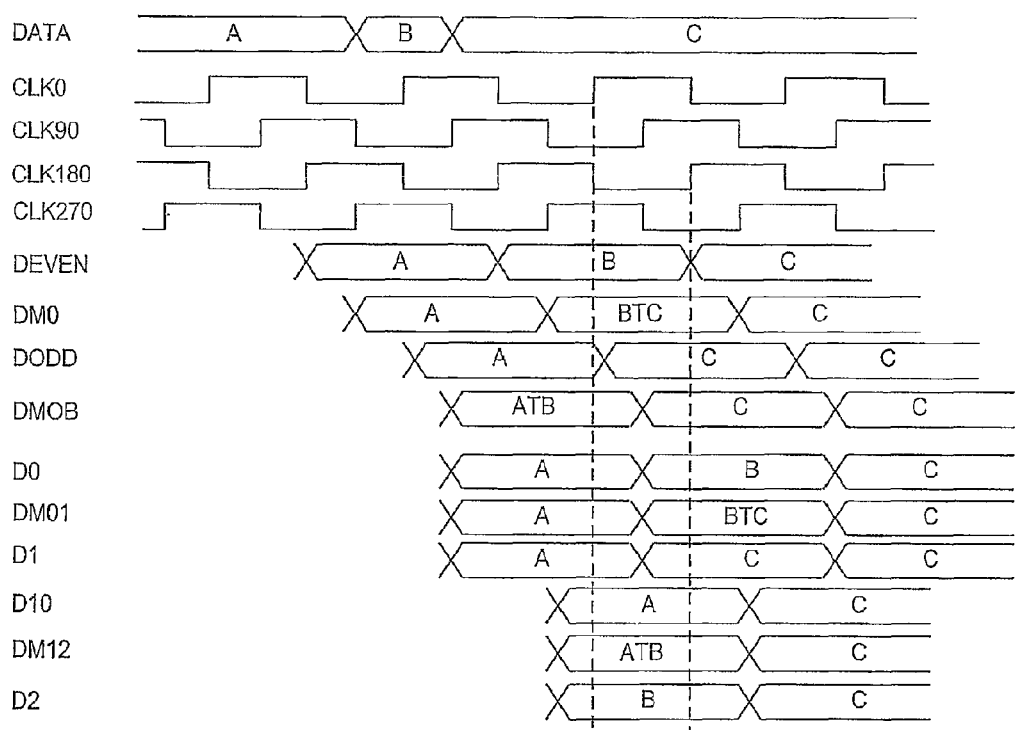
Figure 6:
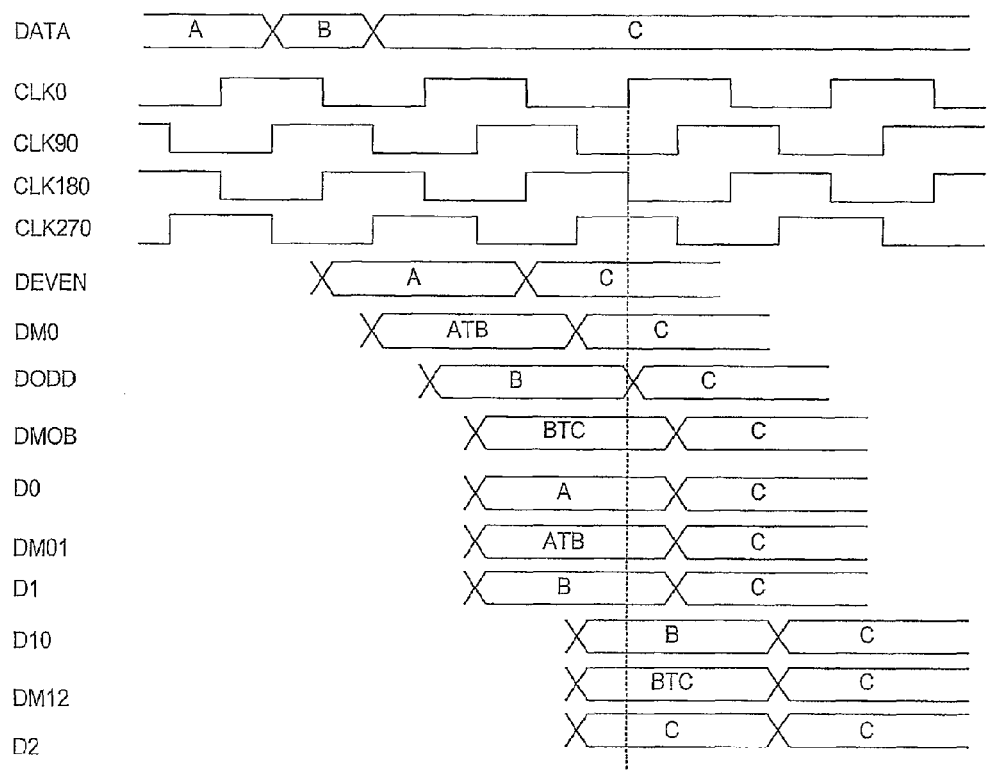

FIG. 4 shows the propagation of eight data bits A-H through the BBPD. Because a BBPD is based on a half-rate architecture, the single-bit transition can occur in one of two positions—i.e., on a rising clock edge or on a falling clock edge. FIGS. 5 and 6 illustrate operation of the BBPD in a scenario where only one single-bit transition occurs. FIG. 5 illustrates the case when the transition falls on an even bit, while FIG. 6 illustrates the case when the transition falls on an odd bit. From FIGS. 5 and 6, it can be seen that if the data are sampled on the rising edge of CLK0 and CLK180, one of two sets of registers Data Reg 1 and Data Reg 2 (incorporating D1, DM01, D1, D10, DM12, D2) will include two transitions for a single-bit transition for operation in full-rate mode. In half-rate mode, at most only one transition will be captured in either set of registers.

Figure 7:
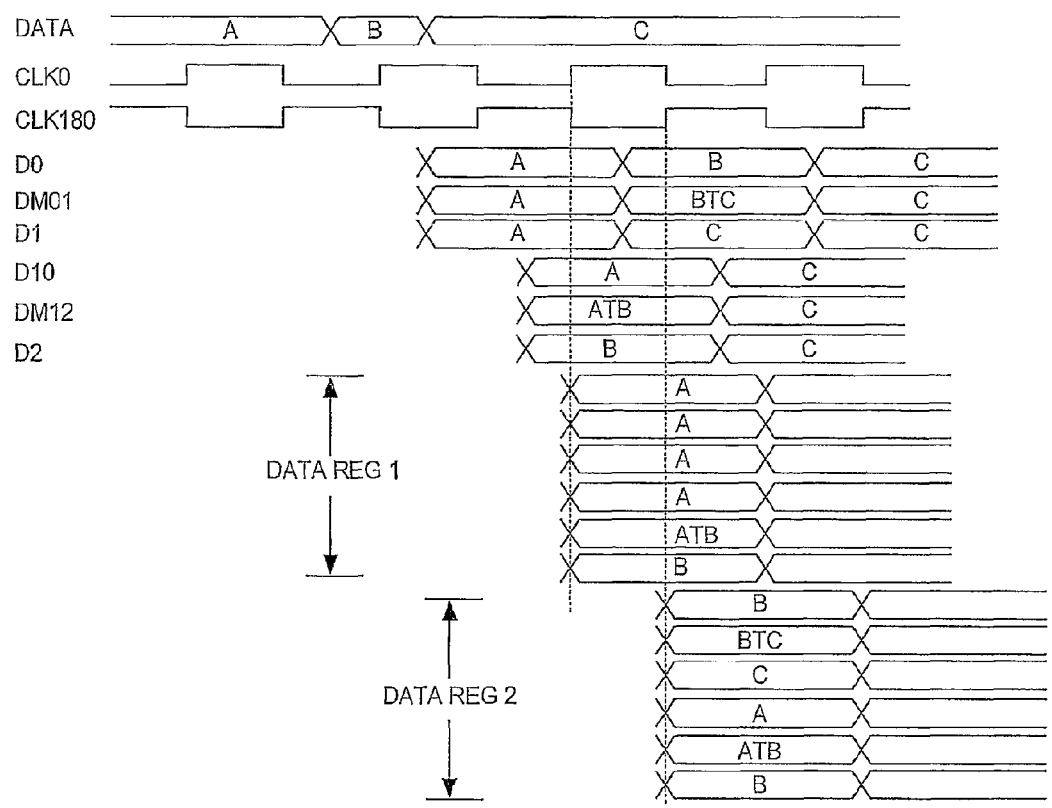
Figure 8:
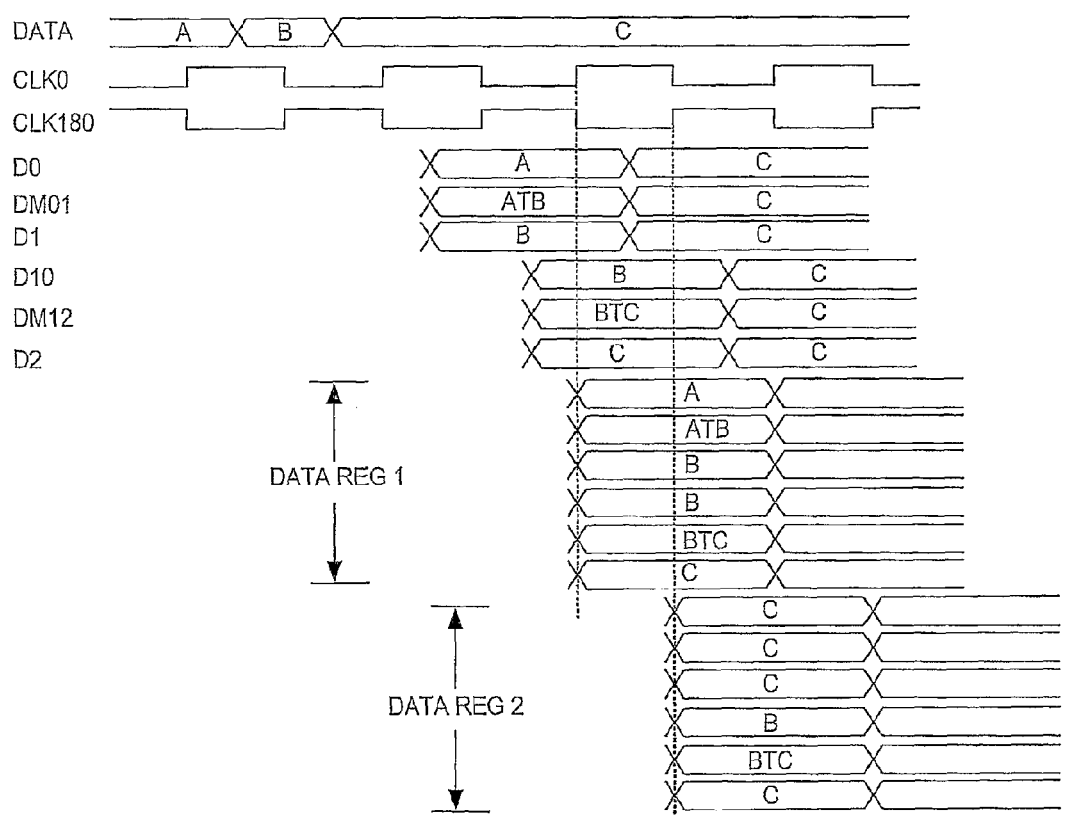

This is illustrated for both odd and even cases respectively in FIGS. 7 and 8. The decision logic is based on the detection of two transitions appearing either in Data Reg 1 or Data Reg 2 during link initialization. The occurrence of two transitions within one of the data registers can only happen if the channel is operating in full-rate mode. Otherwise, if this condition is not met during link initialization, then it is concluded that the channel is operating in half-rate mode.

As stated above, failure to detect transitions would be ambiguous, as it might mean that the channel is operating in half-rate mode, or it might mean that the channel is operating in full-rate mode but no single-bit transitions have occurred. Therefore, preferably the system begins in half-rate mode and switches to full-rate mode on detection of the two transitions within one register set, rather than starting in full-rate mode and trying to use non-detection of two transitions to trigger a switch to half-rate mode. In addition, rate decision logic 22 can be reset to the half-rate mode, to start the rate decision process over, by asserting re-initialize signal 202. This can be done manually by the user or, more likely, by the PLD logic on detection of a condition that suggests that the rate has not been properly detected, or if the PLD logic has restarted some other process that requires the rate decision process to begin again. Rate decision logic 22 also may reset on loss of the received signal or on loss of the recovered clock by CDR circuitry 11.

The logical truth table for the decision logic is as follows:

|   | D0 | DM01 | D1 | D10 | DM12 | D2 | Decision Output |
|---|----|------|----|-----|------|----|----|
| A | 0 | X | 1 | 1 | X | 0 | Full-Rate |
| B | 1 | X | 0 | 0 | X | 1 | Full-Rate | where X signifies "Don't Care." This table means that if either condition A or condition B obtains—i.e., D0, D1, D10 and D2 are 0, 1, 1, 0 or 1, 0, 0, 1, without regard to the states of DM01 and DM12—then it is decided that the channel is operating in full-rate mode. If any other condition obtains, or, more correctly, if neither condition A nor condition B ever obtains during the initialization process, then it is decided that the channel is operating in half-rate mode.

Although the invention has been described in detail for the case where the data rate may be equal to the clock rate or twice the clock rate, as stated above this invention also can be used to determine the data rate in cases where the data rate is some other integer multiple of the clock rate. For example, to determine whether the data rate is equal to four times the clock rate, one would look for four single-bit transitions within the duration spanned by Data Reg 1 or Data Reg 2.

Rate negotiation according to the present invention is based on characteristics of the encoding scheme regardless of protocol. Moreover, it eliminates the need to use logic resources of the PLD to make the rate decision.

This invention also reduces rate acquisition time for at least two reasons. First, the decision is based on the serial clock rather than the deserialized parallel clock, and can essentially run as fast as the BBPD. Second, the CDR circuitry operates in full-rate mode regardless of the rate mode in which the channel is operating, eliminating the need to retrain the CDR circuitry. This also allows the CDR circuitry to operate more efficiently. Most CDR circuits are tuned for high data rate operation with Voltage Controlled Oscillators (VCOs) and Charge Pumps (CPs) that are designed to optimally operate at higher data rates. At lower data rates these VCOs and CPs may not be operating in their optimal regions. However, in accordance with the present invention, the CDR circuitry always runs in full-rate mode, even when the channel is operating in half-rate mode. This improves the jitter performance of the channel.

Thus it is seen that a serial interface with a hardware speed negotiation module, which allows faster processing of data rate changes in response to error signal, has been provided. Implementing this feature on a per-channel basis optimizes system performance, enabling each individual channel to function at its own highest reliable data rate.

Figure 9:
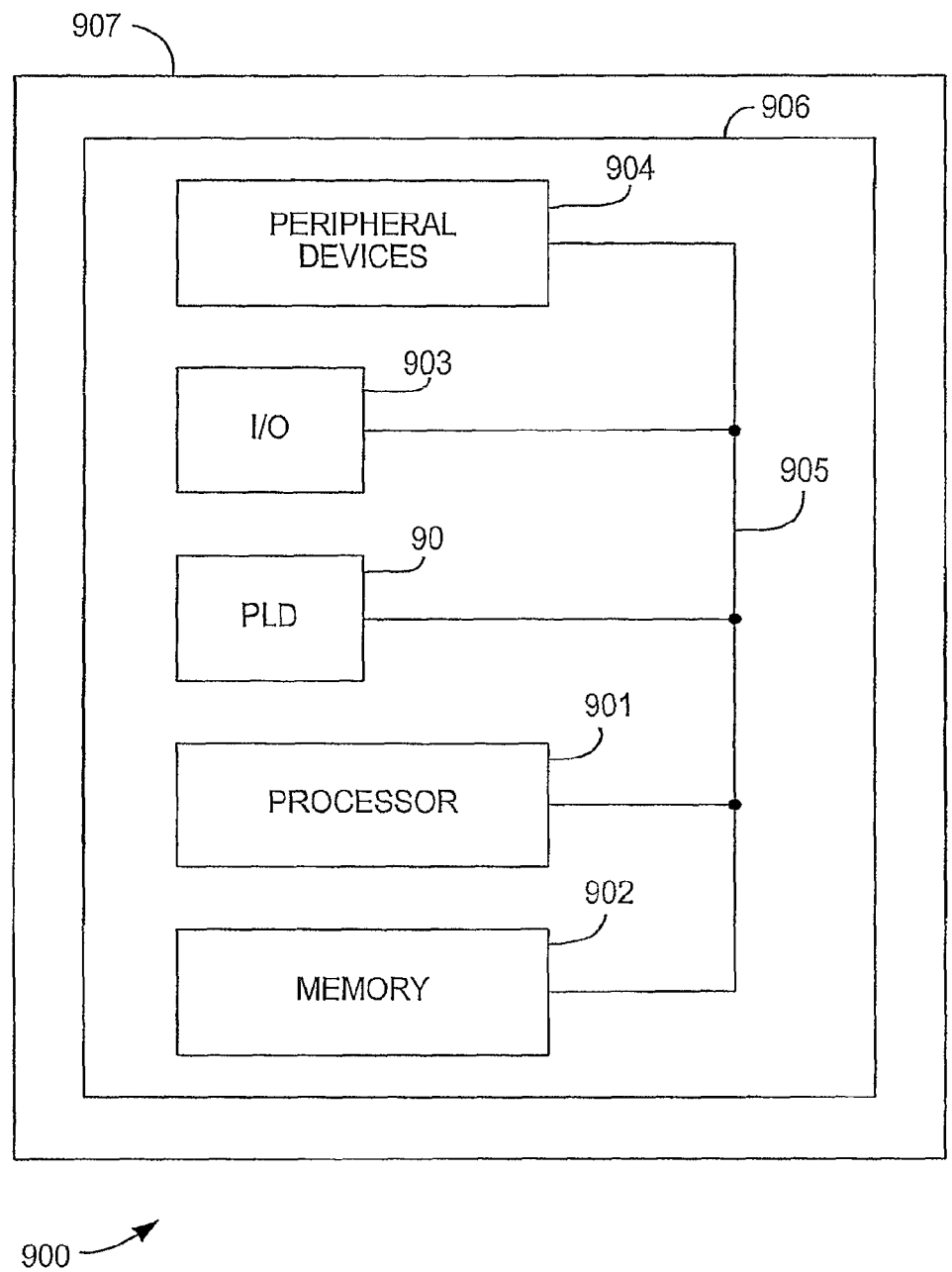
FIG. 9 is a simplified block diagram of an illustrative system employing a programmable logic device incorporating a transceiver using rate negotiation in accordance with the present invention.

A PLD 90 incorporating the present invention may be used in many kinds of electronic devices. One possible use is in a data processing system 900 shown in FIG. 9. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A dedicated serial interface for use in a programmable logic device, said serial interface having a channel and operating at a clock rate, and comprising:
   a receiver portion in said serial interface operable under a plurality of protocols in both a first data rate mode in which data is received at a first data rate substantially equal to said clock rate and a second data rate mode in which data is received at a second data rate substantially equal to an integer multiple of said clock rate;
   rate negotiation circuitry in said serial interface for determining in said serial interface, without regard to which of said plurality of protocols said serial interface is operating under, which of said first and second data rate modes said receiver portion is operating in, based on a number of single-bit transitions detected in said received data within a predetermined duration; and
   clock data recovery circuitry in said serial interface that extracts, from said received data, a clock at said clock rate; wherein:
   said clock data recovery circuitry cooperates with said rate negotiation circuitry to determine which of said modes said receiver portion is operating in;
   said clock data recovery circuitry comprises a bang-bang phase detector;
   said bang-bang phase detector detects said single-bit transitions; and
   said bang-bang phase detector comprises:
   four first-stage registers, each of which is respectively clocked by a respective quadrature phase of said recovered clock, said four first-stage registers outputting four respective first-stage signals representing delayed phases of said received data, and
   six second-stage registers, said six second-stage registers comprising a first group of three registers clocked by a second (90°) quadrature phase of said recovered clock, and a second group of three registers clocked by a fourth (270°) quadrature phase of said recovered clock;
   said registers in said first group receive first, second and third ones of said delayed phases of said received data;

said registers in said second group receive third, fourth and first ones of said delayed phases of said received data; and predetermined states of said six second-stage registers in one of two successive clock cycles signify to said rate negotiation circuitry that said receiver portion is operating in a particular one of said first and second modes.

2. A programmable logic device comprising the serial interface of claim 1.

3. An automatic rate negotiation engine for use in a dedicated transceiver of a programmable logic device, said transceiver operating under an 8 B/10B encoding scheme and including clock data recovery circuitry, said clock data recovery circuitry comprising a phase detector, said automatic rate negotiation engine comprising:

said phase detector, said phase detector receiving input data and a clock recovered by said clock data recovery circuitry;

rate decision logic receiving signals from said phase detector representing transitions in said input data, said rate decision logic determining a data rate of said transceiver from said signals representing transitions and outputting a decision signal; and a line rate clock synthesizer receiving said recovered clock and said decision signal and synthesizing therefrom a line rate for said transceiver.

4. The automatic rate negotiation engine of claim 3 wherein said phase detector is a bang-bang phase detector.

5. The automatic rate negotiation engine of claim 3 wherein:

said input data is received under a particular protocol; and said automatic rate negotiation engine operates based on said transitions without regard to said protocol.

6. The automatic rate negotiation engine of claim 3 wherein a re-initialize signal resets said automatic rate negotiation engine.

7. The automatic rate negotiation engine of claim 3 wherein said decision signal corresponds to a half-rate mode or a full-rate mode.

8. The automatic rate negotiation engine of claim 3 wherein said line rate is a half-rate clock or a full-rate clock.

9. The automatic rate negotiation engine of claim 4 wherein said bang-bang phase detector comprises:

a plurality of first-stage registers; and a plurality of second-stage registers for signifying to said automatic rate negotiation engine that said transceiver is operating in a particular mode.

10. A method for automatic rate negotiation in a dedicated transceiver of a programmable logic device, said transceiver operating under an 8B/10B encoding scheme and including clock data recovery circuitry, said clock data recovery circuitry comprising a phase detector, said method comprising:

receiving, using said phase detector, input data and a clock; and receiving, using an automatic rate negotiation engine, signals from said phase detector representing transitions in said input data, wherein the automatic rate negotiation engine:

determines a data rate of said transceiver from said signals representing transitions; and outputs a decision signal.

11. The method of claim 10 further comprising;

receiving, using a line rate clock synthesizer, said clock and said decision signal; and synthesizing therefrom a line rate for said transceiver.

12. The method of claim 10 wherein said phase detector is a bang-bang phase detector.

13. The method of claim 10 wherein:

said input data is received under a particular protocol; and said automatic rate negotiation engine operates based on said transitions without regard to said protocol.

14. The method of claim 10 wherein a re-initialize signal resets said automatic rate negotiation engine.

15. The method of claim 10 wherein said decision signal corresponds to a half-rate mode or a full-rate mode.

16. The method of claim 10 wherein said clock is recovered by clock data recovery circuitry.

17. The method of claim 11 wherein said line rate is a half-rate clock or a full-rate clock.

18. The method of claim 12 wherein said bang-bang phase detector comprises:

a plurality of first-stage registers; and a plurality of second-stage registers for signifying to said automatic rate negotiation engine that said transceiver is operating in a particular mode.

* * * * *